United States Patent
Ishikura et al.

(10) Patent No.: US 9,484,206 B2
(45) Date of Patent: Nov. 1, 2016

(54) SEMICONDUCTOR DEVICE INCLUDING CATALYST LAYER AND GRAPHENE LAYER THEREON AND METHOD FOR MANUFACTURING THE SAME

(71) Applicant: KABUSHIKI KAISHA TOSHIBA, Minato-ku, Tokyo (JP)

(72) Inventors: Taishi Ishikura, Kuwana Mie (JP); Akihiro Kajita, Yokkaichi Mie (JP); Tadashi Sakai, Yokohama Kanagawa (JP); Atsunobu Isobayashi, Yokkaichi Mie (JP); Makoto Wada, Yokkaichi Mie (JP); Tatsuro Saito, Yokkaichi Mie (JP); Masayuki Kitamura, Yokkaichi Mie (JP); Atsuko Sakata, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/637,041

(22) Filed: Mar. 3, 2015

(65) Prior Publication Data

US 2016/0056256 A1    Feb. 25, 2016

(30) Foreign Application Priority Data

Aug. 20, 2014  (JP) .................. 2014-167886

(51) Int. Cl.
| | | |
|---|---|---|
| H01L 23/48 | (2006.01) | |
| H01L 21/283 | (2006.01) | |
| H01L 23/544 | (2006.01) | |
| H01L 21/02 | (2006.01) | |
| H01L 29/16 | (2006.01) | |

(52) U.S. Cl.
CPC ......... *H01L 21/283* (2013.01); *H01L 21/0243* (2013.01); *H01L 21/02527* (2013.01); *H01L 21/02645* (2013.01); *H01L 23/544* (2013.01); *H01L 29/1606* (2013.01); *H01L 2223/54426* (2013.01)

(58) Field of Classification Search
CPC .... H01L 21/283; H01L 23/544; H01L 29/45
USPC .................................................. 257/750, 797
See application file for complete search history.

(56) References Cited

U.S. PATENT DOCUMENTS

2014/0167268 A1* 6/2014 Bao .................. H01L 23/53276
                                                          257/761

FOREIGN PATENT DOCUMENTS

JP         2013172083 A       9/2013

OTHER PUBLICATIONS

Related U.S. Appl. No. 14/176,993, filed Feb. 10, 2014, Title: "Semiconductor Device and Manufacturing Method of the Same", First Named Inventor: Atsunobu Isobayashi.
Related U.S. Appl. No. 14/656,542, First Named Inventor: Atsunobu Isobayashi, filed Mar. 12, 2015, Title: "Semiconductor Device".

* cited by examiner

*Primary Examiner* — Hung Vu
(74) *Attorney, Agent, or Firm* — Holtz, Holtz & Volek PC

(57) ABSTRACT

According to one embodiment, a semiconductor device is disclosed. The device includes a foundation layer including first and second layers being different from each other in material, and the foundation layer including a surface on which a boundary of the first and second layers is presented, a catalyst layer on the surface of the foundation layer, and the catalyst layer including a protruding area. The device further includes a graphene layer being in contact with the protruding area.

19 Claims, 15 Drawing Sheets

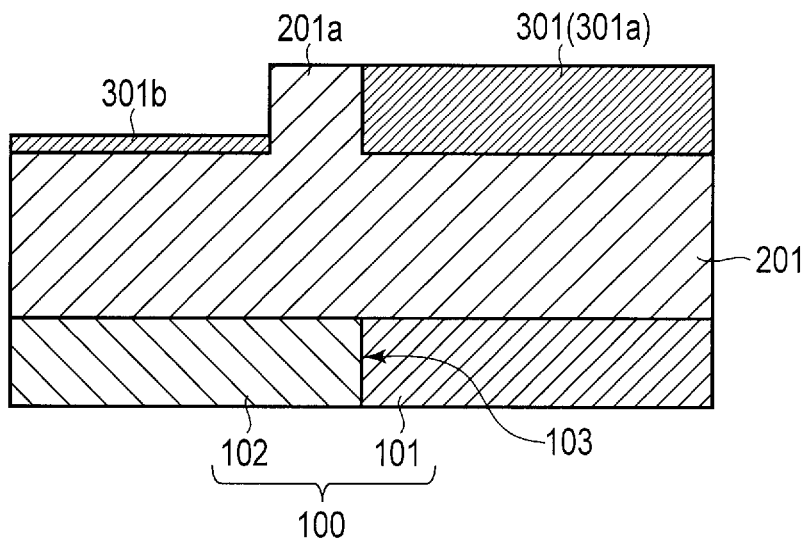
F I G. 1
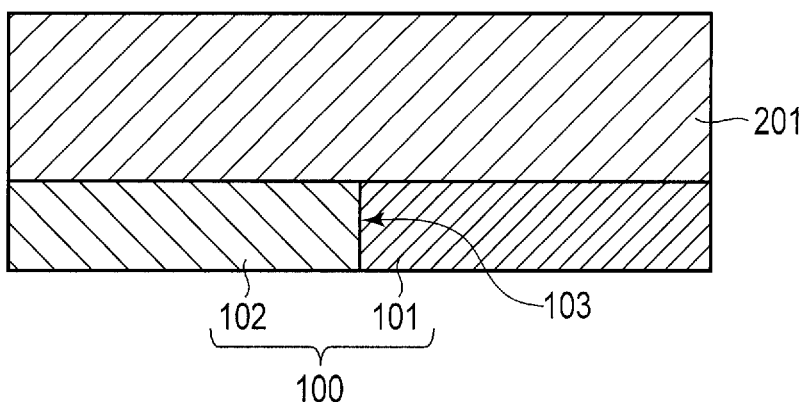
F I G. 2

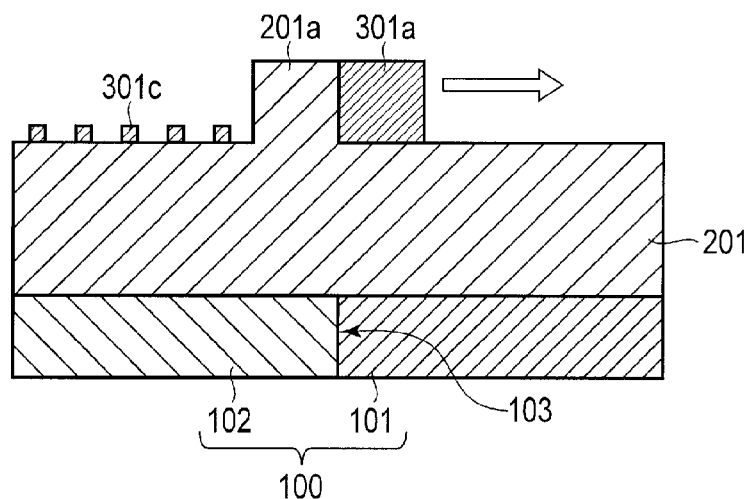
F I G. 3
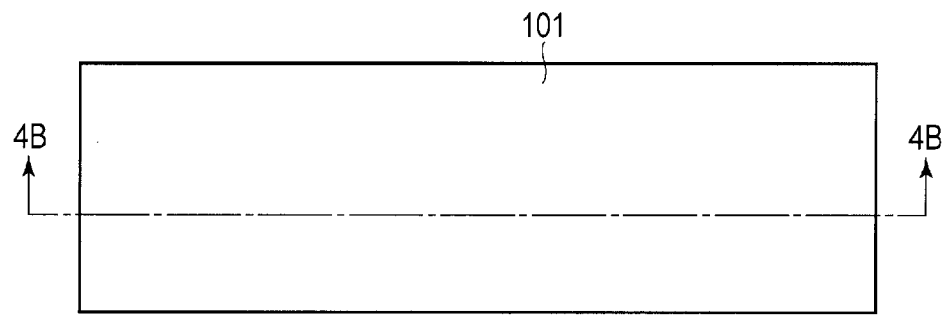
F I G. 4A
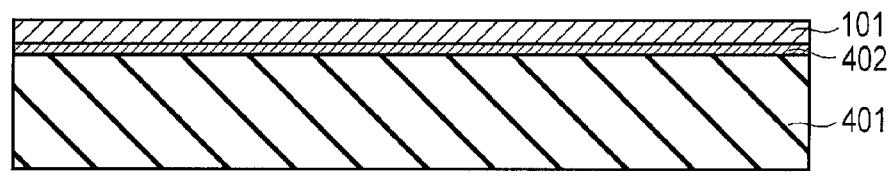
F I G. 4B

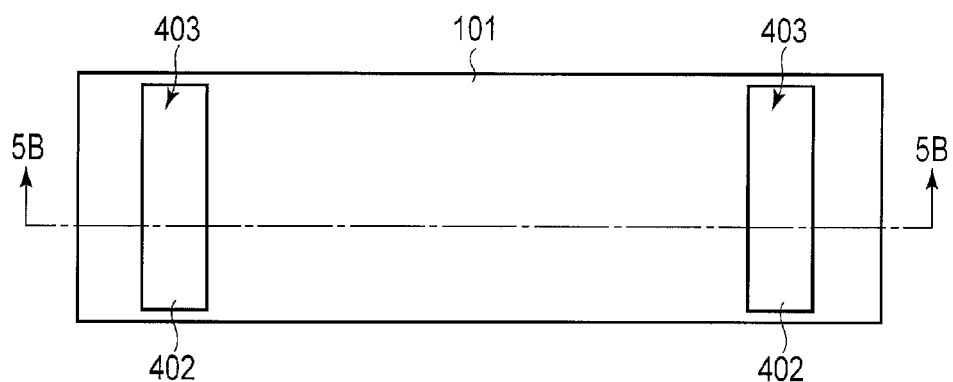
F I G. 5A
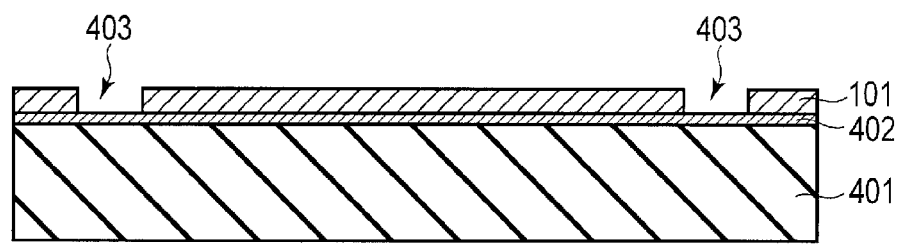
F I G. 5B

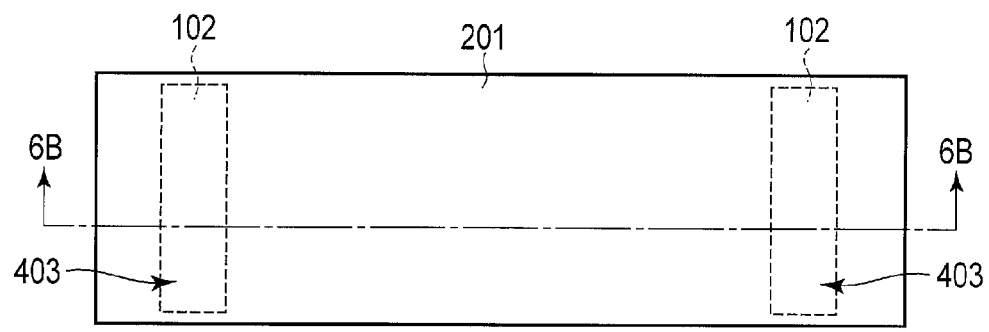
F I G. 6A
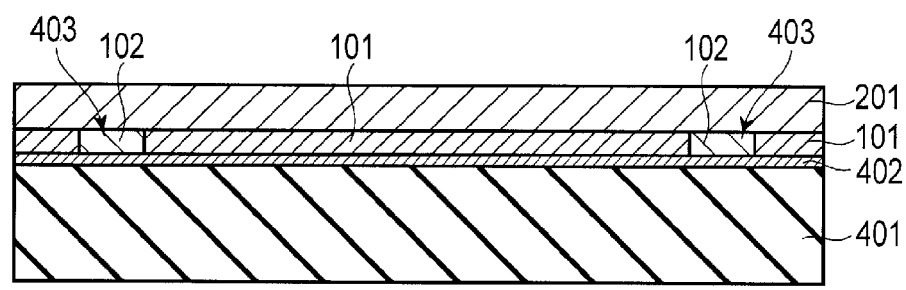
F I G. 6B

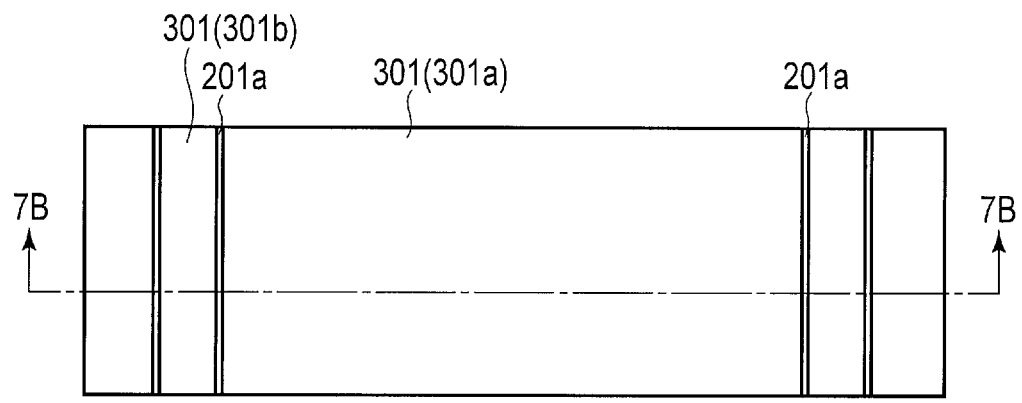
F I G. 7A
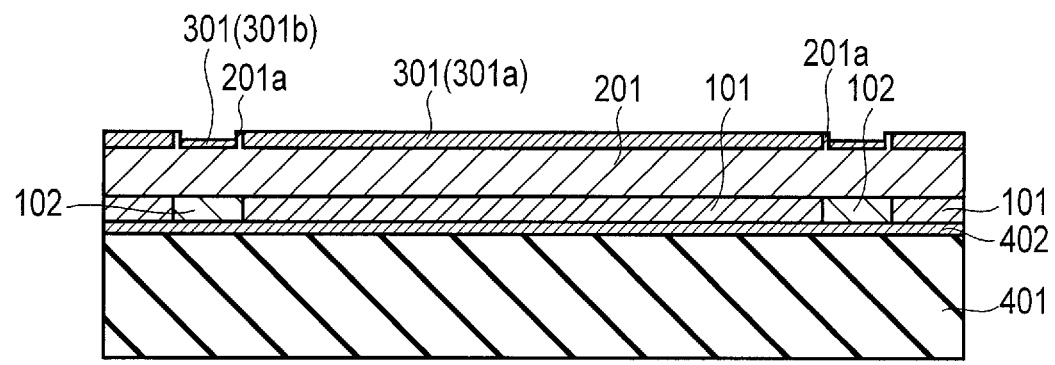
F I G. 7B

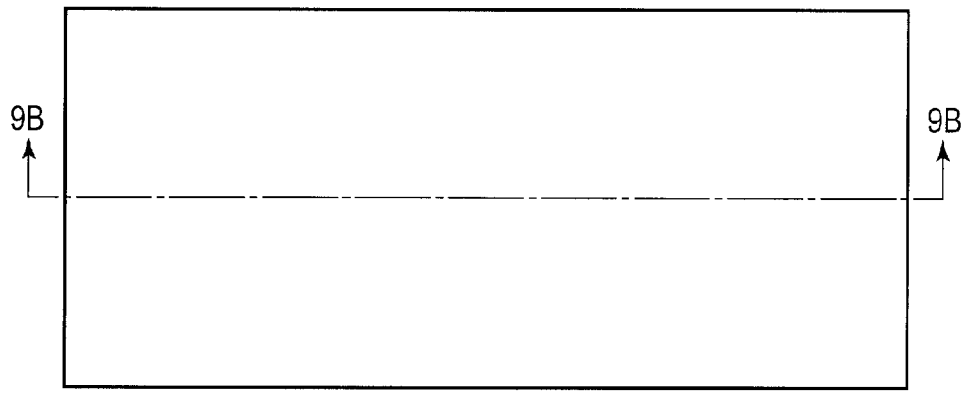
F I G. 9A
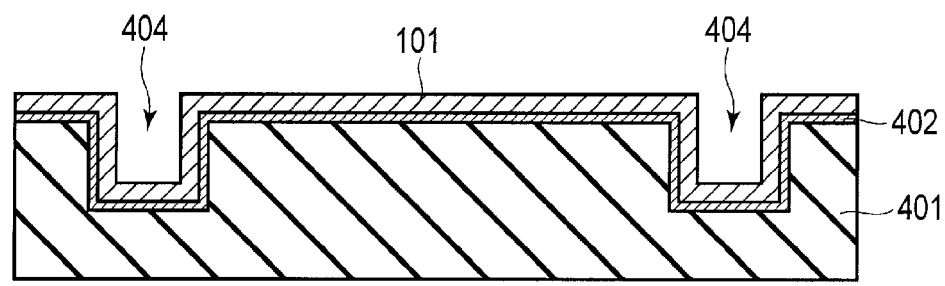
F I G. 9B

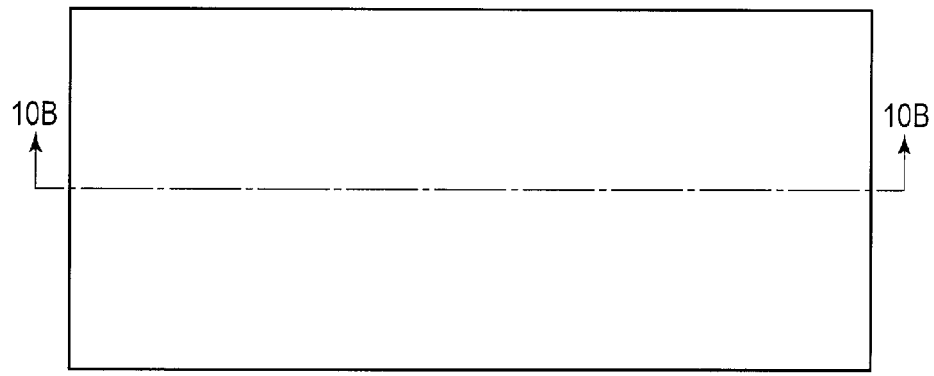
F I G. 10A
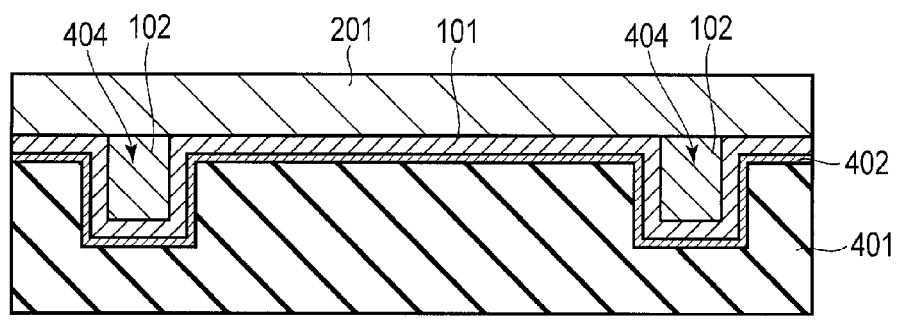
F I G. 10B

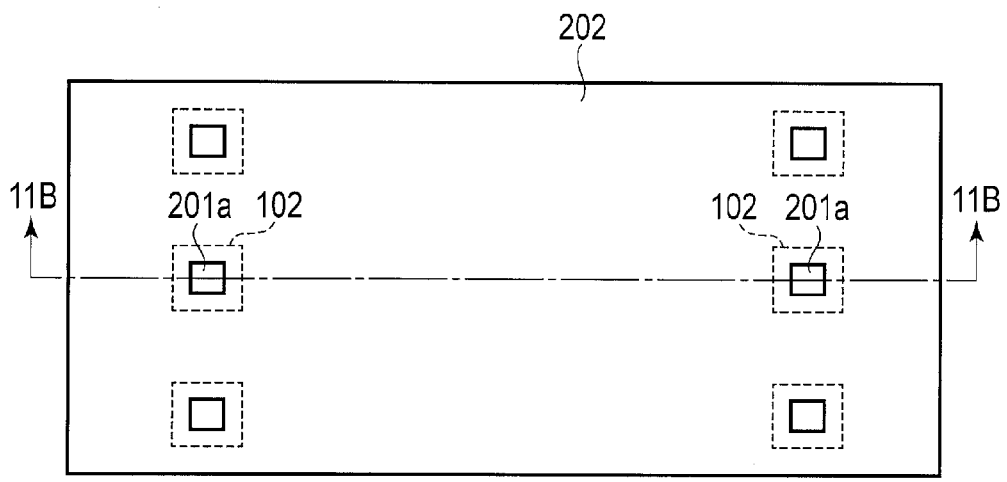
F I G. 11A
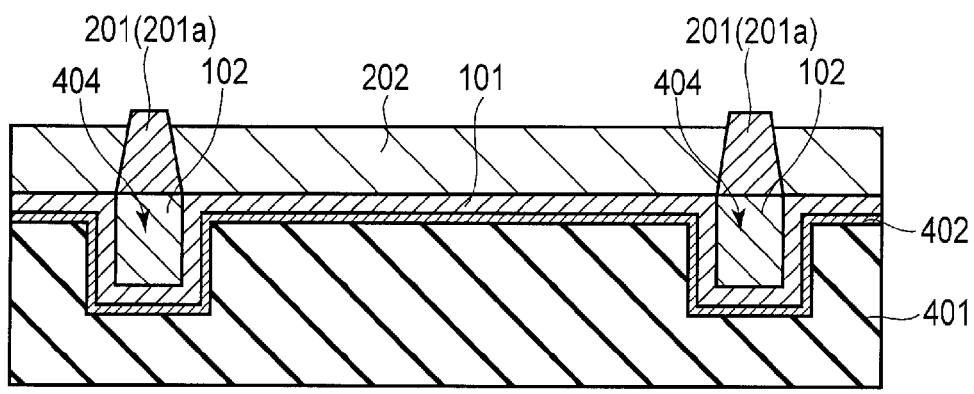
F I G. 11B

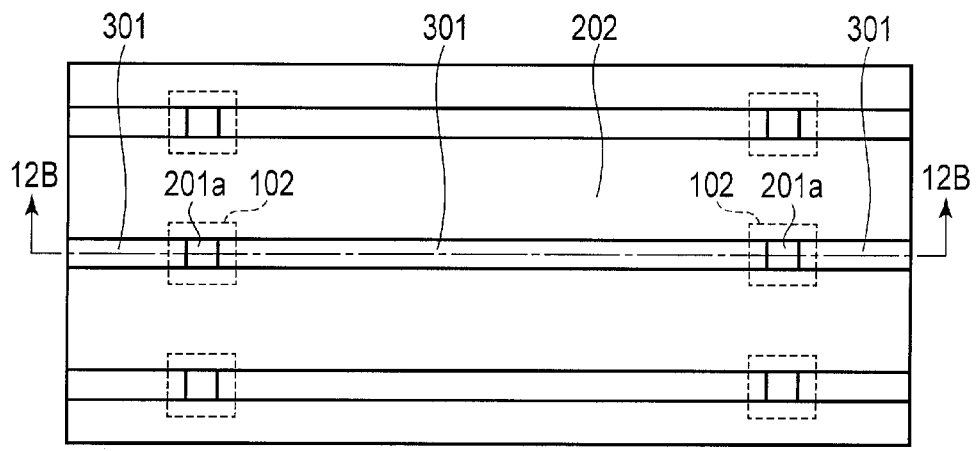
F I G. 12A
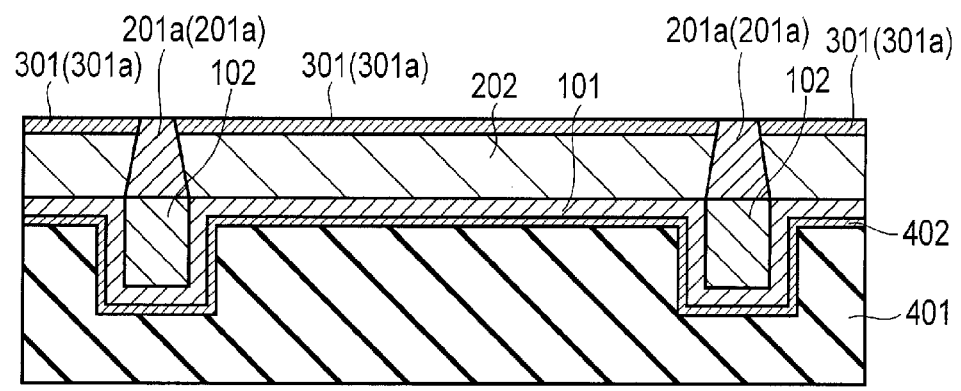
F I G. 12B

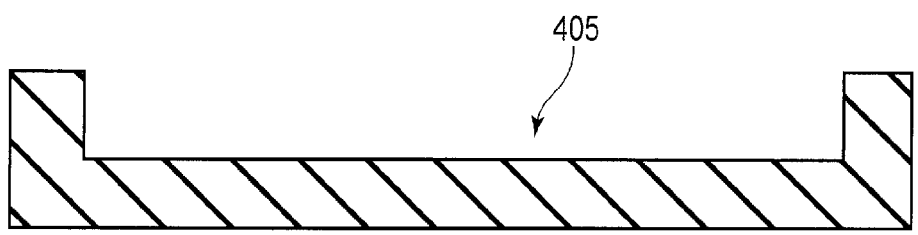
F I G. 14
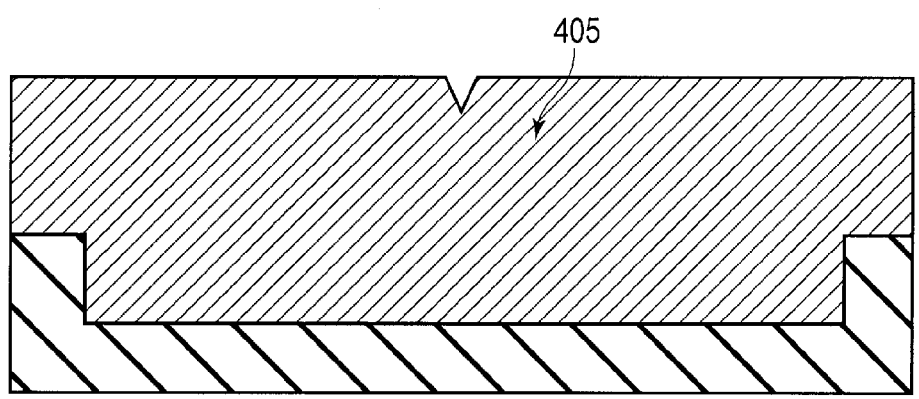
F I G. 15
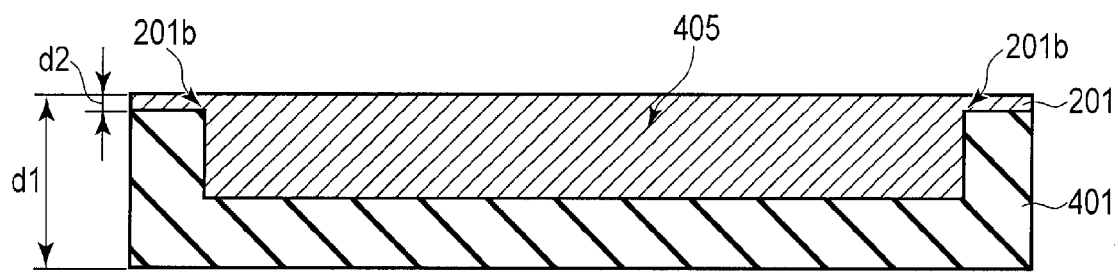
F I G. 16

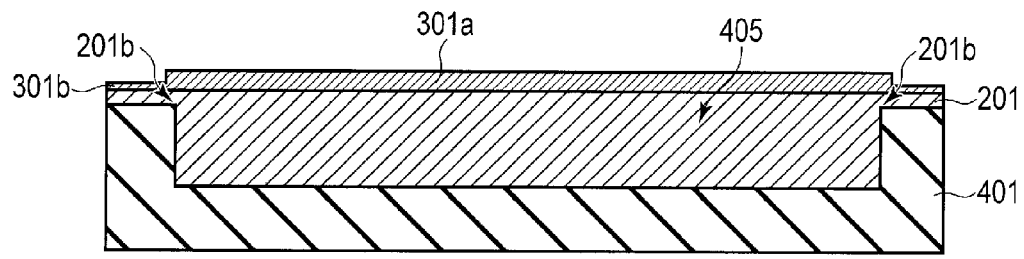
F I G. 17
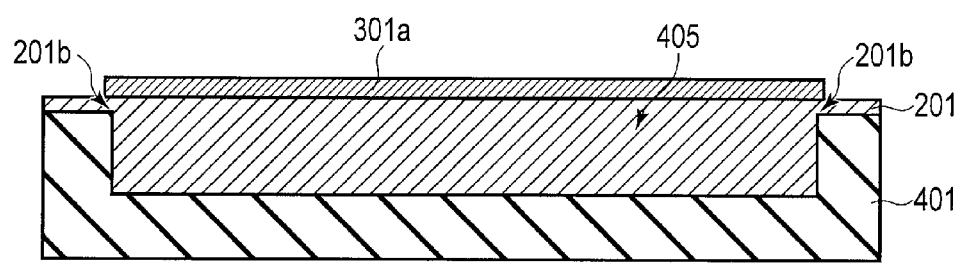
F I G. 18
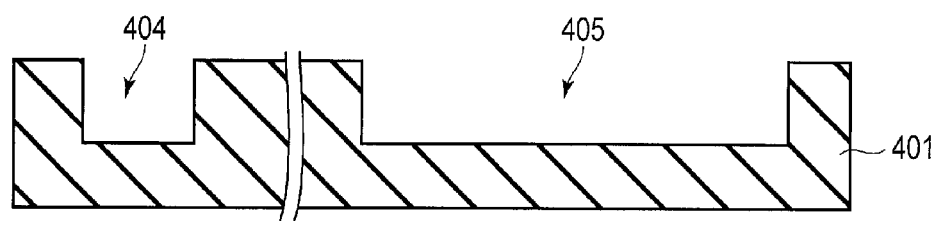
F I G. 19

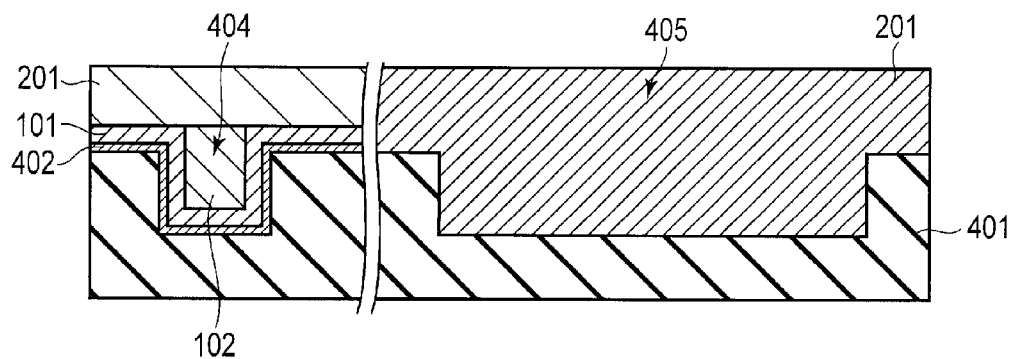
F I G. 20
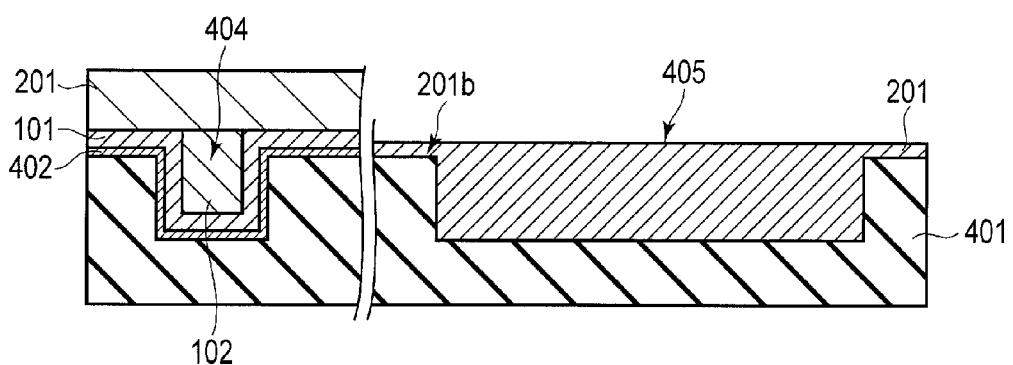
F I G. 21
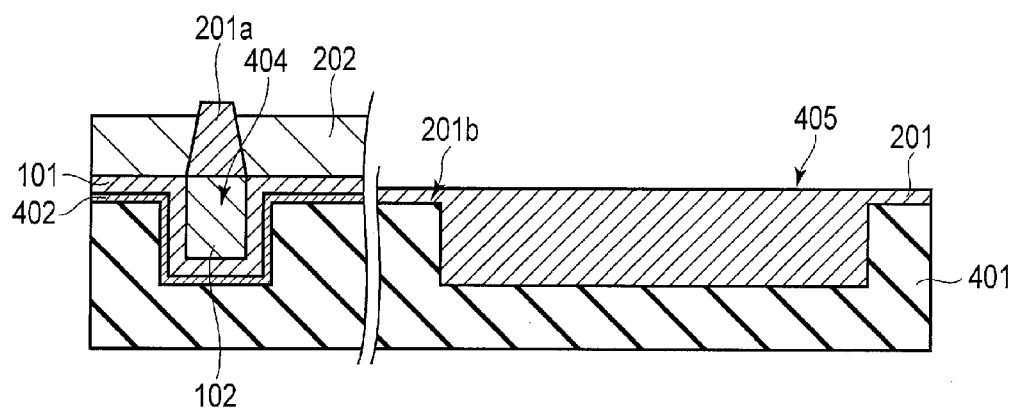
F I G. 22

SEMICONDUCTOR DEVICE INCLUDING CATALYST LAYER AND GRAPHENE LAYER THEREON AND METHOD FOR MANUFACTURING THE SAME

CROSS-REFERENCE TO RELATED APPLICATIONS

This application is based upon and claims the benefit of priority from Japanese Patent Application No. 2014-167886, filed Aug. 20, 2014, the entire contents of which are incorporated herein by reference.

FIELD

Embodiments described herein relate generally to a semiconductor device which includes graphene and a method for manufacturing the same.

BACKGROUND

In recent years, the miniaturization of a wiring has advanced in an LSI wiring structure, which arises a problem such as an increasing of electric resistivity caused by interfacial inelastic scattering of electrons, an increasing of current density, or a reliability degradation by stress migration or electro-migration. Copper, low-resistance metal, is mainly used as a wiring material for LSI, however the problem still arises with the advance of microfabrication of the wiring structure.

Then, it is examined to use graphene as the wiring material for LSI. It is well known that quantized conductance (what is called Ballistic conductance) is generated in the graphene, and the graphene is expected to be an extremely low resistance material as an alternative to the existing metallic materials.

BRIEF DESCRIPTION OF THE DRAWINGS

FIG. 1 is a cross-sectional view schematically illustrating a semiconductor device of a first embodiment;

FIG. 2 is a cross-sectional view for explaining a method for manufacturing the semiconductor device of the first embodiment;

FIG. 3 is a cross-sectional view for explaining the method for manufacturing the semiconductor device of the first embodiment, following FIG. 2;

FIG. 4A is a plan view for explaining a method for manufacturing a semiconductor device of a second embodiment;

FIG. 4B is a cross-sectional view for explaining the method for manufacturing the semiconductor device of the second embodiment;

FIG. 5A is a plan view for explaining the method for manufacturing the semiconductor device of the second embodiment, following FIG. 4A;

FIG. 5B is a cross-sectional view for explaining the method for manufacturing the semiconductor device of the second embodiment, following FIG. 4B;

FIG. 6A is a plan view for explaining the method for manufacturing the semiconductor device of the second embodiment, following FIG. 5A;

FIG. 6B is a cross-sectional view for explaining the method for manufacturing the semiconductor device of the second embodiment, following FIG. 5B;

FIG. 7A is a plan view for explaining the method for manufacturing the semiconductor device of the second embodiment, following FIG. 6A;

FIG. 7B is a cross-sectional view for explaining the method for manufacturing the semiconductor device of the second embodiment, following FIG. 6B;

FIG. 9A is a plan view for explaining a method for manufacturing a semiconductor device of a third embodiment;

FIG. 9B is a cross-sectional view for explaining the method for manufacturing the semiconductor device of the third embodiment;

FIG. 10A is a plan view for explaining the method for manufacturing the semiconductor device of the third embodiment, following FIG. 9A;

FIG. 10B is a plan view for explaining the method for manufacturing the semiconductor device of the third embodiment, following FIG. 9B;

FIG. 11A is a plan view for explaining the method for manufacturing the semiconductor device of the third embodiment, following FIG. 10A;

FIG. 11B is a cross-sectional view for explaining the method for manufacturing the semiconductor device of the third embodiment, following FIG. 10B;

FIG. 12A is a plan view for explaining the method for manufacturing the semiconductor device of the third embodiment, following FIG. 11A;

FIG. 12B is a cross-sectional view for explaining the method for manufacturing the semiconductor device of the third embodiment, following FIG. 11B;

FIG. 14 is a cross-sectional view for explaining a method for manufacturing a semiconductor device of a fourth embodiment;

FIG. 15 is a cross-sectional view for explaining the method for manufacturing the semiconductor device of the fourth embodiment, following FIG. 14;

FIG. 16 is a cross-sectional view for explaining the method for manufacturing the semiconductor device of the fourth embodiment, following FIG. 15;

FIG. 17 is a cross-sectional view for explaining the method for manufacturing the semiconductor device of the fourth embodiment, following FIG. 16;

FIG. 18 is a cross-sectional view for explaining the method for manufacturing the semiconductor device of the fourth embodiment, following FIG. 17;

FIG. 19 is a cross-sectional view for explaining a method for manufacturing another semiconductor device of the fourth embodiment;

FIG. 20 is a cross-sectional view for explaining the method for manufacturing the another semiconductor device of the fourth embodiment, following FIG. 19;

FIG. 21 is a cross-sectional view for explaining the method for manufacturing the another semiconductor device of the fourth embodiment, following FIG. 20;

FIG. 22 is a cross-sectional view for explaining the method for manufacturing the another semiconductor device of the fourth embodiment, following FIG. 21.

DETAILED DESCRIPTION

Figure 8A:
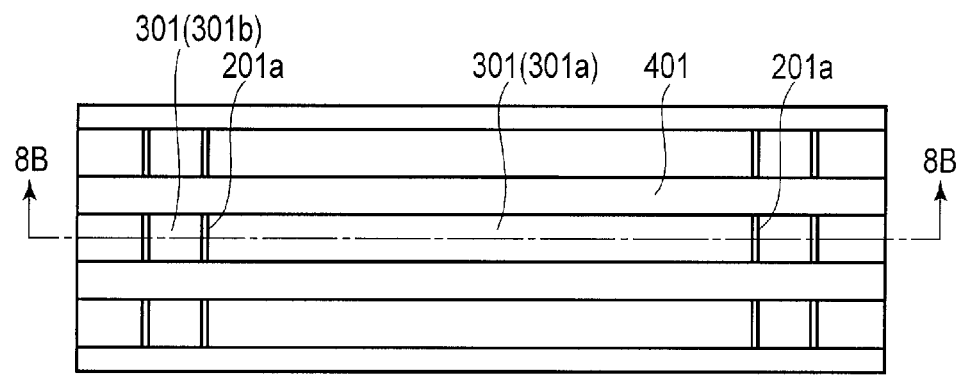
FIG. 8A is a plan view for explaining the method for manufacturing the semiconductor device of the second embodiment, following FIG. 7A.

In general, according to one embodiment, a semiconductor device is disclosed. The device includes a foundation layer including first and second layers being different from each other in material, and the foundation layer including a surface on which a boundary of the first and second layers is presented; a catalyst layer on the surface of the foundation layer, and the catalyst layer including a protruding area. The device further includes a graphene layer being in contact with the protruding area.

In general, according to another embodiment, a semiconductor device is disclosed. The device includes an insulating film including a surface and a trench in the surface. The device further includes a catalyst layer on the surface. The catalyst layer includes a first portion which is on a bottom of the trench and a second portion which is outside the trench. A thickness of the first portion is larger than a depth of the trench, and a thickness of the second portion is smaller than the thickness of the first portion. The device further includes a graphene layer on the catalyst layer.

In general, according to yet another embodiment, a method for manufacturing a semiconductor device is disclosed. The method includes forming a foundation layer including first and second layers being different from each other in material, and the foundation layer including a surface on which a boundary of the first and second layers is presented. The method further includes forming a catalyst layer including a protruding area, on the surface of the foundation layer; and forming a graphene layer by growing graphene using the protruding area as a starting point of growth.

Embodiments will be described hereinafter with reference to the accompanying drawings. In the drawings, the same reference numbers denote the same reference numbers or corresponding portions, and duplicated descriptions are made as needed.

(First Embodiment)

FIG. 1 is a cross-sectional view schematically illustrating a semiconductor device of the present embodiment.

The semiconductor device of the present embodiment comprises a aggregation layer (a foundation layer) 100, a catalyst layer 201 formed on the aggregation layer 100 and including a convex (protruding) area 201a, and a graphene layer 301 formed on the catalyst layer 201 and being in contact with the convex area 201a.

The aggregation layer 100 includes a first aggregation layer 101 and a second aggregation layer 102, which are different from each other in material. The first aggregation layer 101 and the second aggregation layer 102 are adjoiningly in contact with each other. A boundary 103 of the first aggregation layer 101 and the second aggregation layer 102 is present in a surface of the aggregation layer 100.

The convex area 201a of the catalyst layer 201 is formed on an area corresponding to the boundary 103. In the present embodiment, the convex area 201a is above the second aggregation layer 102 adjacent to the boundary 103. The convex area 201a may be above the first and second aggregation layers 101 and 102 which are adjacent to the boundary 103. Furthermore, in addition to the convex area 201a, a plurality of fine convex areas may exist above the second aggregation layer 102 except the vicinity of the boundary 103. Each of the fine convex areas is smaller than the convex area 201a.

The graphene layer 301 includes a first graphene layer 301a and a second graphene layer 301b. The first graphene layer 301a is formed on the catalyst layer 201 which is on the first aggregation layer 101. The first graphene layer 301a is a continuous layer without break. The second graphene layer 301b is formed on the catalyst layer 201 which is on the second aggregation layer 102. The first graphene layer 301a is thicker than the second graphene layer 301b.

Now, a semiconductor device of the present embodiment will be further described according to its manufacturing method.

[FIG. 2]

An aggregation layer 100, a catalyst layer 201 are successively formed on a substrate (not illustrated). The substrate includes, for instance, a semiconductor substrate such as a silicon substrate, and an interlayer insulating film formed on the semiconductor substrate. Elements, for example, transistors, capacitors, or the like are formed on the semiconductor substrate.

The aggregation layer 100 includes a first aggregation layer 101 and a second aggregation layer 102. The first aggregation layer 101 and the second aggregation layer 102 are formed in a same plane, and are adjoiningly in contact with each other. The second aggregation layer 102 promotes aggregation of the catalyst layer 201 more than the first aggregation layer 101 does. In other words, the catalyst layer 201 on the second aggregation layer 102 is more movable than the catalyst layer 201 on the first aggregation layer 101.

The material of the catalyst layer 201 is, for example, metal such as Ni, Co, Fe, or Cu (a metallic catalyst).

When the metallic catalyst is used, the material of the first aggregation layer 101 is, for example, metal such as Cr, Tc, Ru, Os, Re, C, Pd, Pt, Rh, Ir, Cd, or W. This kind of metal diffuses in the metallic catalyst, and elevates a melting point of the metallic catalyst. As a result, the catalyst layer 201 on the first aggregation layer 101 less easily aggregates.

The material of the second aggregation layer 102 is such a material as Ti, TiN, Ta, or TaN (a barrier metal), for instance.

[FIG. 3]

A chemical vapor deposition (CVD) process is used for depositing carbon on the catalyst layer 201 and growing graphene on the catalyst layer 201. In this way, a continuous graphene 301a without break, i.e., the first graphene layer 301a of high quality, is formed.

In the present specification, the graphene includes at least one of a monolayer graphene and a layer of laminated a plurality of monolayer graphene (laminated graphene). The graphene layer is a layer including the graphene.

The mechanism of growing the first graphene layer 301a is considered as below.

In the above CVD process, the second aggregation layer 102 near the boundary 103 is aggregate to have the convex area 201a. The convex area 201a functions as a growth starting point of grapheme. More particularly, a plurality of monolayer graphemes grow using a side surface of the convex area 201a as a growth starting point in a manner that the plurality of monolayer graphemes extend over a surface which is nonparallel to the side surface, for example, a surface which is perpendicular to the side surface, thereby the grapheme is formed. Therefore, the graphene layer 301a is formed by the plurality of monolayer graphemes being laminated in a direction parallel to the side surface of the convex area 201a. The source gas including carbon, which is used for the CVD process, is a source of carbon. The convex area 201a is supplied with carbon during the CVD process. As a result, the growing of the graphene using the convex area 201a as a growth starting point continues, and the continuous graphene 301a without break, i.e., the first graphene layer 301a of high quality is obtained.

On the other hand, fine convex areas (projections) that are not illustrated in the drawings are generated on the surface of the catalyst layer 201 which is on the second aggregation layer 102, and a plurality of graphenes 301c grow in a flake shape for instance using the fine convex areas as a growth starting point.

Such a growth continues to change the plurality of graphenes 301c into a single body, thereby the graphene layer 301b is also formed on the catalyst layer 201 which is on the second aggregation layer 102 (FIG. 1). All or part of the fine convex areas may disappear in the widely known step which is performed after the step of FIG. 3. Alternatively, a step for the purpose of removing all or part of the fine convex areas maybe performed after the step of FIG. 3.

The first graphene layer 301a is thicker than the second graphene layer 301b, and is used as an interconnect for instance. The second graphene layer 301b may be remained, or removed. Since a current flows through the catalyst layer 201 which is below the second grapheme 301b, the second graphene layer 301b can be used as a part of the interconnects when the length of the second graphene layer 301b is short.

(Second Embodiment)

Figure 8B:
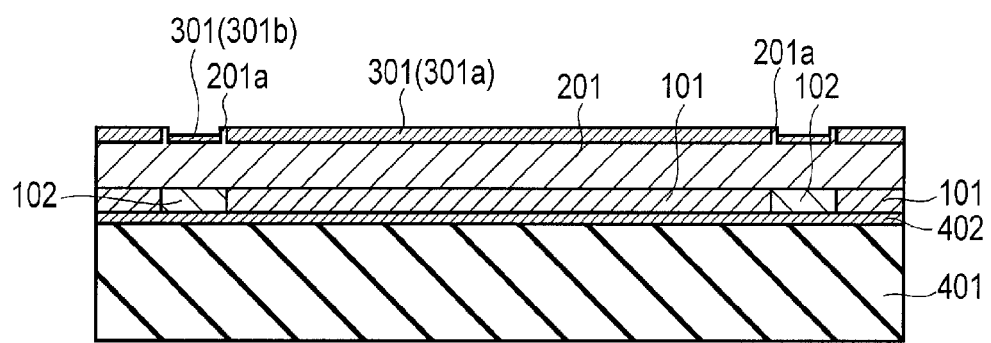
FIG. 8B is a cross-sectional view for explaining the method for manufacturing the semiconductor device of the second embodiment, following FIG. 7B.
Figure 13A:
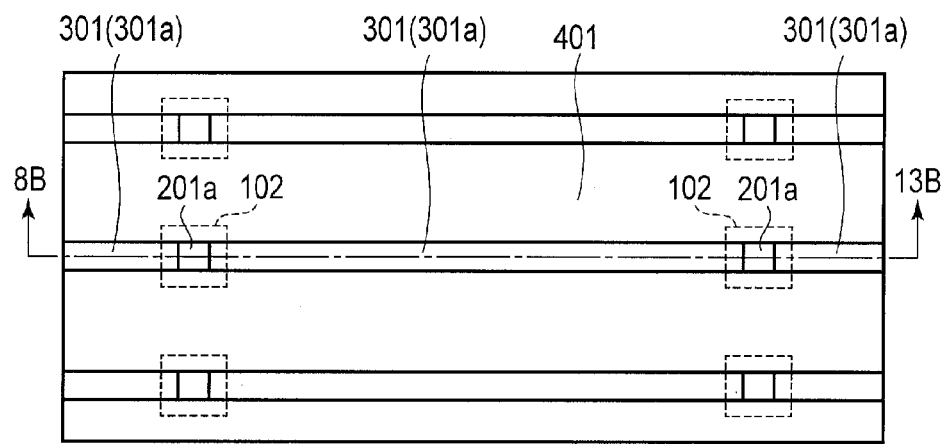
FIG. 13A is a plan view for explaining the method for manufacturing the semiconductor device of the third embodiment, following FIG. 12A.
Figure 13B:
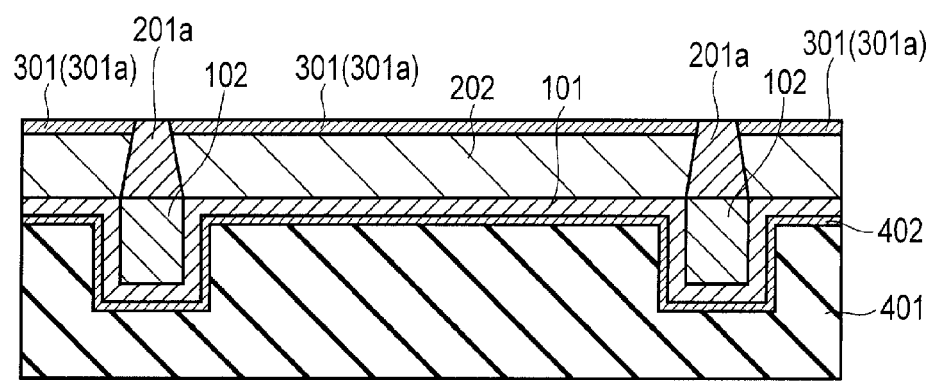
FIG. 13B is a cross-sectional view for explaining the method for manufacturing the semiconductor device of the third embodiment, following FIG. 12B.
Figure 23:
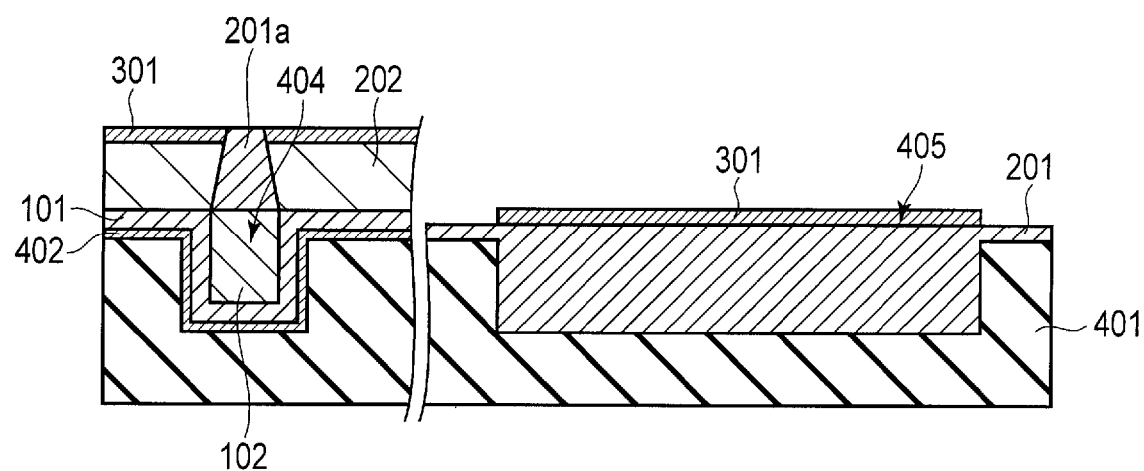
FIG. 23 is a cross-sectional view for explaining the method for manufacturing the another semiconductor device of the fourth embodiment, following FIG. 22.

A semiconductor device of the present embodiment uses a aggregation layer including a first aggregation layer 101 having openings 403 and second aggregation layers 102 filling the openings 403. Now, the semiconductor device of the present embodiment will be further described below in accordance with its manufacturing method with reference to plan views and cross-sectional views illustrated in FIGS. 4A and 4B to FIGS. 8A and 8B.

[FIG. 4A, FIG. 4B]

An interlayer insulating film 401, a barrier metal film 402, and a first aggregation layer 101 are successively formed on a substrate (not illustrated). The barrier metal film 402 can be omitted depending on the material of the catalyst layer or the second aggregation layer.

[FIG. 5A, FIG. 5B]

The openings 403 are formed in the first aggregation layer 101 by using photolithography process and etching process.

[FIG. 6A, FIG. 6B]

The openings 403 are filled with the second aggregation layer 102, and the first and second aggregation layers 10 and 102 are planarized, by using damascene process. The openings 403 maybe filled with the second aggregation layer 102 by deposition of the second aggregation layer 102 and etch back of the second aggregation layer 102. Thereafter, the catalyst layer 201 is formed on the first and second aggregation layers 101 and 102.

[FIG. 7A, FIG. 7B]

The graphene layer 301 (301a, 301b) is formed on the catalyst layer 201 by CVD process. In the same way as the first embodiment, the graphene grows using the convex (protruding) areas 201a of the catalyst layer 201 as a growth starting point, and a continuously long first graphene layer 301a without break is formed on the catalyst layer 201. In addition, similar to the first embodiment, the second graphene layer 301b is also formed on the catalyst layer 201.

[FIG. 8A, FIG. 8B]

A resist pattern (not shown) is formed on the catalyst layer 201a and the graphene layer 301, and the graphene layer 301, the catalyst layer 201, the first aggregation layer 101 and the barrier metal film 402 are etched using the resist pattern as a mask, thereby a linear interconnect including the catalyst layer 201 and the graphene layer 301 (301a, 301b) is formed.

Here, a difference of thickness between the first graphene layer 301a and the second graphene layer 301b (height difference) is 17 nm, for instance. Such a small height difference does not cause obstruction to the photolithography process for forming the resist pattern.

According to the present embodiment, the continuously long first graphene layer 301a without break can be used for the interconnect, so that a long interconnect with low resistance is realized. The long interconnect is, for example, a bit line.

(Third Embodiment)

In a semiconductor device of the present embodiment, a aggregation layer including a first aggregation layer 101 formed on the interlayer insulating film 401 having trenches 404 and a second aggregation layer 102 filling the trenches 404 via the first aggregation layer 101 is used. Now, the semiconductor device in the present embodiment will be further described below in accordance with its manufacturing method with reference to plan views and cross-sectional views of FIGS. 9A and 9B to FIGS. 12A and 12B.

[FIG. 9A, FIG. 9B]

An interlayer insulating film 401 is formed on a substrate (not illustrated), then trenches 404 are formed in the surface of the interlayer insulating film 401, and a barrier metal film 402, first aggregation layer 101 are successively formed on the interlayer insulating film 401. The barrier metal film 402 is formed to cover bottom surfaces and side surfaces of the trenches 404. The first aggregation layer 101 is formed to cover the bottom surfaces and side surfaces of the trenches 404 via the barrier metal film 402.

[FIG. 10A, FIG. 10B]

The trenches 404 are filled with the second aggregation layer 102, and the first and second aggregation layers 10 and 102 are planarized, by using damascene process. The trenches 404 maybe filled with the second aggregation layer 102 by deposition of the second aggregation layer 102 and etch back of the second aggregation layer 102. Thereafter, the catalyst layer 201 is formed on the first and second aggregation layers 101 and 102.

[FIG. 11A, FIG. 11B]

The catalyst layer is alloyed by heat treatment to form convex areas (protrusions) 201a on the second aggregation layer 102. Reference number 202 denotes an alloyed catalyst layer (an alloy layer). The convex areas of the catalyst layer 201a are projected from upper surface of the alloy layer 202. That is, the alloy layer 202 is formed on the first aggregation layer 101 such a manner that upper portions of the convex areas of the catalyst layer 201a are exposed.

The alloy layer 202 includes an alloy of the metal in the first aggregation layer 101 (first metal) and the metal in the catalyst layer (second metal). The above heat treatment causes the first metal to diffuse into the catalyst layer and produces a reaction of the first metal and the second metal, thereby the alloy layer 202 is formed.

After the heat treatment, no catalyst layer is present on the first aggregation layer 101 except for trenches 404, and the catalyst layers 201 are present only on the second aggregation layers 102. In the present embodiment, the catalyst layers 201 are convex areas 201a.

The heat treatment decreases the amount of the first metal in the first aggregation layer 101, and thus the first aggregation layer 101 become thinner, however, the first aggregation layer 101 is illustrated to have the same thickness before and after the heat treatment in the drawings for the sake of simplicity.

The heat treatment is performed in an atmosphere including a noble gas such as argon, or in an atmosphere including an inert gas such as nitrogen. In addition, the heat treatment is performed in a temperature of 300-1000° C.

[FIG. 12A, FIG. 12B]

The graphene layer 301 is formed on the alloy layer 202 by CVD process. In the present embodiment, the graphene grows using the catalyst layer 201 (convex areas 201a) as a growth starting point, and the continuously long first graphene layer 301a without break is formed on the alloy layer 202.

[FIG. 13A, FIG. 13B]

A resist pattern (not shown) is formed on the graphene layer 301, and the graphene layer 301, the alloy layer 202, the catalyst layer 201, the first aggregation layer 101 and the barrier metal film 402 are etched using the resist pattern as a mask, thereby a linear interconnect including the alloy layer 202 and the first graphene layer 301a is formed.

According to the present embodiment, the graphene layer 301 (301a) which does not include the thin second graphene layer 301b is realizes, so that a long interconnect with lower resistance is realized.

(Fourth Embodiment)

In the first through the third embodiment, the catalyst layer having the convex area is formed by utilizing the first and second aggregation layers differing from each other in material, and the convex area is used as a growing origin of grapheme, but as for the present embodiment, a catalyst layer having regions having different thickness is formed by utilizing an interlayer insulating film having a trench, and those parts of the catalyst layer that are near the boundary between the regions having different thickness are used as a growth starting point for the graphene.

[FIG. 14]

An interlayer insulating film 401 is formed on a substrate (not shown), and a trench 405 is formed in the surface of the interlayer insulating film 401. Trench 405 is larger in size (a diameter or an opening area) than the trenches 404 in the third embodiment.

[FIG. 15]

A catalyst layer 201 thicker than the depth of trench 405 is formed on the interlayer insulating film 401. Trench 405 is filled with the catalyst layer 201.

[FIG. 16]

The catalyst layer 201 is thinned in a manner that the surface of the interlayer insulating film 401 is not exposed, and the surface of the catalyst layer 201 is planarized, by a chemical mechanical polishing (CMP) process. Reactive ion etching (RIE) process may be used instead of the CMP process.

A thickness of the part of the catalyst layer 201 located outside the trench 405 is smaller than a thickness of the catalyst layer 201 located on a bottom surface of the trench 405. The thin catalyst layer aggregates more easily than the thick catalyst layer. Therefore, the catalyst layer 201b, which is near the boundary between the thin part of the catalyst layer 201 outside trench 405 and the thick part of the catalyst layer 201 on the bottom surface of trench 405, can be used as a growth starting point of the graphene.

In order to use the catalyst layer 201b as a growth starting point of the graphene, the difference between the thickness d1 of the thick part of the catalyst layer 201 on the bottom of trench 405 and the thickness d2 of the thin part of the catalyst layer 201 outside trench 405 (d2−d1) is, for example, 25 nm.

It is noted that the structure in FIG. 16 is also obtained by the following method. That is, the structure in FIG. 16 is also obtained by thinning the catalyst layer 201 using CMP process or RIE process until the surface of the interlayer insulating film 401 is exposed, and subsequently by depositing a catalyst layer on the exposed surface of the interlayer insulating film 401 and on the surface of the catalyst layer 201.

The structure in FIG. 16 is also obtained by another method in which the catalyst layer 201 is etched back until the surface of the interlayer insulating film 401 is exposed, and subsequently a catalyst layer is deposited on the exposed surface of the interlayer insulating film 401 and on the surface of the catalyst layer 201.

[FIG. 17]

The graphene layers 301a, 301b are formed on the catalyst layer 201 by CVD process. A continuously large first graphene layer 301a without break is grown on the trench 405 and the surface of the interlayer insulating film 401 peripheral of the trench 405. A thin second graphene layer 301b is formed on the surface of the interlayer insulating film 401 located outside the catalyst layer 201b.

[FIG. 18]

The second graphene layer 301b is removed, and the first graphene layer 301a is processed into a predetermined shape by using photolithography process and etching process. For instance, the first graphene layer 301a is processed to have a shape of an alignment mark.

According to the present embodiment, the interlayer insulating film 401 with the trench 405 formed in its surface, the catalyst layer 201 formed on the surface of the interlayer insulating film 401 and having the first thickness d1 of the part on the bottom surface of the trench 405 being larger than the depth of the trench and having second thickness d2 of the part outside the trench that being larger than the first thickness d1, and the high quality first graphene layer 301a formed on the catalyst layer 201 and having the predetermined shape are realized.

When the first graphene layer 301a of the present embodiment is used as an alignment mark, the first graphene layer 301a of the present embodiment can be formed in the same step as the first graphene layer 301a of the third embodiment. A further explanation will be given with reference to the cross-sectional views of FIG. 19 to FIG. 22. In FIG. 19 to FIG. 22, the left side of the break line illustrates a step of forming the interconnect of the third embodiment, and the right side of the break line illustrates a step of forming the alignment mark of the present embodiment. In the following, the left side area of the break line is referred to as a interconnect area, and the right side area of the break line is referred to as a mark area.

[FIG. 19]

Trenches 404, 405 are formed in the surface of the interlayer insulating film 401.

[FIG. 20]

The barrier metal film 402, the first aggregation layer 101 and the second aggregation layer 102 are formed in the interconnect area on the condition that the mark area is covered with a mask (not shown) such as a resist. The mask of the mark area is remove, and subsequently, the catalyst layer 201 is formed on the interconnect area and the mark area. Then, the surface of the catalyst layer 201 is planarized by CMP process.

[FIG. 21]

The catalyst layer 201 in the mark area is thinned on the condition that the mark area is covered with a mask (not shown) such as a resist, thereby the catalyst layer 201b is formed, which is a growth starting point of the grapheme in the mark area. After that, the mask of the interconnect area is removed.

[FIG. 22]

The catalyst layer is alloyed by heat treatment, thereby the convex areas 201a is formed, which is a growth starting point of the grapheme in the interconnect area.

The order of the step of FIG. 21 and the step of FIG. 22 maybe reversed.

[FIG. 23]

The graphene is grown using the catalyst layer 201a and the catalyst layer 201b as a growth starting point, and the grown graphene (graphene layer) is processed to form the graphene layer 301 constituting the interconnect and the graphene layer 301 constituting the alignment mark respectively in the interconnect area and the mark area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a foundation layer including first and second layers being different from each other in material, the foundation layer including a surface on which a boundary of the first and second layers is presented;
a catalyst layer on the surface of the foundation layer, the catalyst layer including a protruding area, and an edge portion of the protruding area or a part of the protruding area except the edge portion being disposed directly above the boundary of the first and second layers; and
a graphene layer in contact with the protruding area.

2. The device according to claim 1, wherein the catalyst layer is on the first and second layers.

3. The device according to claim 2, wherein the graphene layer is on the catalyst layer which is on the first layer.

4. The device according to claim 2, wherein the graphene layer includes a first graphene layer on the catalyst layer which is on the first layer and a second graphene layer on the catalyst layer which is on the second layer, and the first graphene layer is thicker than the second graphene layer.

5. The device according to claim 2, wherein the second layer has an opening, and the first layer is in the opening.

6. The device according to claim 1, wherein the second layer promotes aggregation of the catalyst layer more than the first layer does.

7. The device according to claim 1, wherein
a material of the first layer includes Cr, Tc, Ru, Os, Re, C, Pd, Pt, Rh, Ir, Cd, or W;
a material of the second layer includes Ti, TiN, Ta, or TaN; and
a material of the catalyst layer includes Ni, Co, Fe, or Cu.

8. The device according to claim 7, wherein the catalyst layer includes the material of the first layer.

9. The device according to claim 1, wherein the graphene layer constitutes an interconnect.

10. The device according to claim 1, wherein the protruding area of the catalyst layer is away from both a first edge portion of the catalyst layer and a second edge portion of the catalyst layer, and the first edge portion and the second edge portion are opposite to each other.

11. The device according to claim 1, wherein the edge portion of the protruding area, or the part of the protruding area except the edge portion, overlaps the boundary of the first and second layers when viewed from a direction perpendicular to the surface of the foundation layer.

12. A semiconductor device comprising:
a foundation layer including first and second layers being different from each other in material, the foundation layer including a surface on which a boundary of the first and second layers is presented;
a catalyst layer on the first and second layers of the surface of the foundation layer, the catalyst layer including a protruding area;
a graphene layer in contact with the protruding area; and
an insulating film including a surface and a trench in the surface,
wherein the second layer is on an inner surface of the trench and on the surface outside the trench, and the first layer is selectively presented in the trench and fills the trench via the second layer.

13. The device according to claim 12, wherein the catalyst layer is selectively on the first layer.

14. The device according to claim 13, further comprising an alloy layer on the second layer outside the trench.

15. The device according to claim 14, wherein the alloy layer is on the first layer outside the trench in a manner that an upper portion of the catalyst layer is exposed.

16. The device according to claim 14, wherein the alloy layer includes an alloy of a material of the first layer and a material of the catalyst layer.

17. The device according to claim 14, wherein the graphene layer is in contact with an upper portion of the catalyst layer, and is on the alloy layer.

18. A semiconductor device comprising:
an insulating film including a surface and a trench in the surface;
a catalyst layer on the surface, the catalyst layer including a first portion which is on a bottom of the trench and a second portion which is outside the trench, the first portion having a first thickness larger than a depth of the trench, and the second portion having a second thickness smaller than the first thickness; and
a graphene layer on the catalyst layer.

19. The device according to claim 18, wherein the graphene layer constitutes an alignment mark.

* * * * *